United States Patent [19]

Kimura

[11] Patent Number: 5,183,510
[45] Date of Patent: Feb. 2, 1993

[54] APPARATUS AND PROCESS FOR CHEMICAL VAPOR DEPOSITION

[75] Inventor: Takafumi Kimura, Hiratsuka, Japan

[73] Assignee: Fujitsu Limited, Kawasaki, Japan

[21] Appl. No.: 443,317

[22] Filed: Nov. 30, 1989

[30] Foreign Application Priority Data

Nov. 30, 1988 [JP] Japan ................. 63-305264

[51] Int. Cl.⁵ .............................................. C23C 16/46
[52] U.S. Cl. .................................. 118/719; 118/715;
118/724; 118/725; 156/611; 156/612; 156/613;
427/255.1; 427/255.2; 427/255.3
[58] Field of Search ............... 118/715, 719, 725, 724;
156/611, 612, 613; 427/255.1, 255.2, 255.3

[56] References Cited

U.S. PATENT DOCUMENTS

| | | | |
|---|---|---|---|
| 3,517,643 | 6/1970 | Goldstein | 118/715 |
| 4,389,973 | 6/1983 | Suntola et al. | |
| 4,650,539 | 3/1987 | Irving | 156/613 |
| 4,689,093 | 8/1987 | Ishihara | 427/255.2 |
| 4,702,791 | 10/1987 | Mimura | 156/613 |
| 4,911,102 | 3/1990 | Manabe | 156/613 |
| 4,931,425 | 6/1990 | Kimura | 427/255.2 |
| 4,945,857 | 8/1990 | Marinace | 118/723 |

FOREIGN PATENT DOCUMENTS 63-58919 3/1988 Japan.
64-733 1/1989 Japan.
PCT/US89/-
225 8/1989 PCT Int'l Appl..

1392514 4/1975 United Kingdom.

OTHER PUBLICATIONS

Itoh, Journal of Materials Science 21 (1986) 3677-3680.
Patent Abstracts of Japan, vol. 13, No. 21 (C-560) [3369], Jan. 18, 1989, & JP-A-63-225528, Sep. 20, 1988.

Primary Examiner—Richard Bueker
Attorney, Agent, or Firm—Staas & Halsey

[57] ABSTRACT

An apparatus for a chemical vapor deposition of a compound film on a substrate, comprising: a plurality of gas-generating chambers each containing an evaporating boat for a solid source containing a component element of a compound film to be formed on a substrate, provided with a heating element for heating and evaporating the solid source, having an inlet for a carrier gas and a gas outlet, and arranged such that effective gas-generating portions thereof are thermally isolated from each other; a gas-mixing chamber for mixing gases from said gas-generating chambers, provided with a heater element for heating a gas passing therethrough and having inlets for gases flowing from said gas-generating chambers and an outlet for a gas mixture; and a film-growing chamber containing a substrate on which a compound film is formed by a gas phase reaction, provided with a heating element for heating the substrate, and having an inlet for a gas mixture flowing from said gas-mixing chamber and an exhaust gas outlet. Also disclosed is a chemical vapor deposition process using the disclosed apparatus.

17 Claims, 6 Drawing Sheets

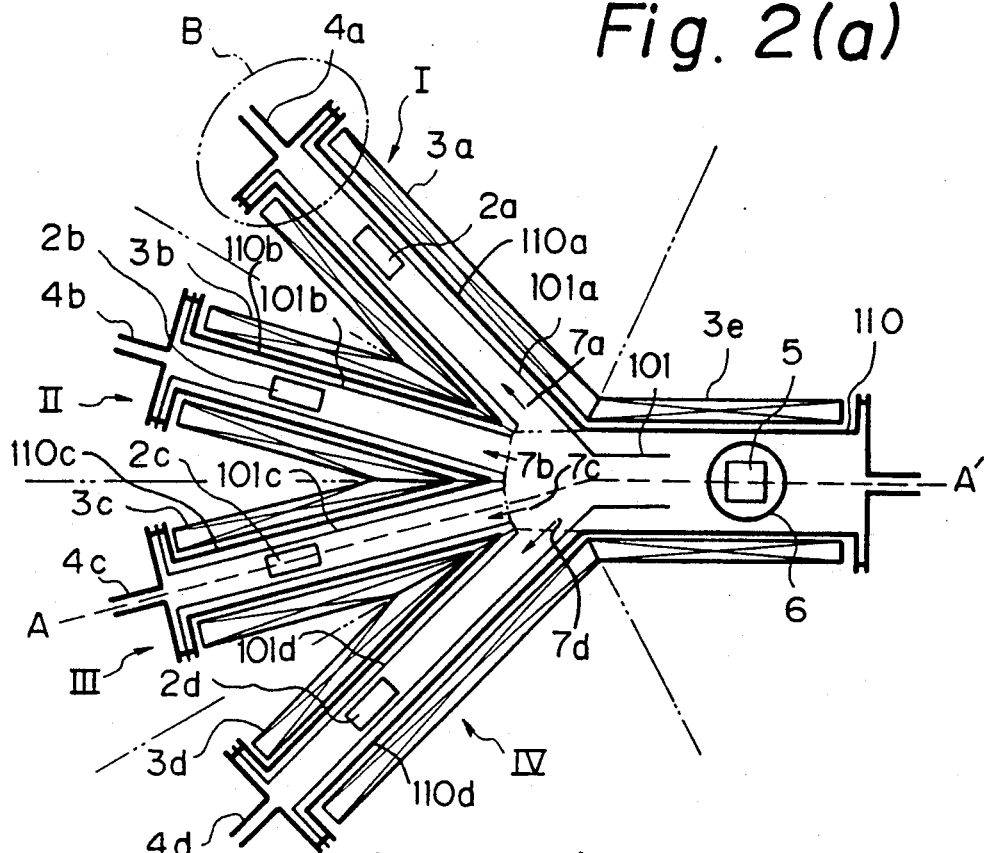
Fig. 2(a)
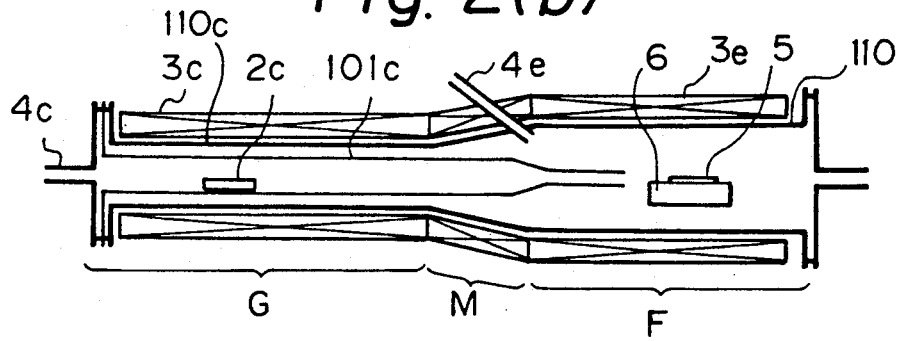
Fig. 2(b) A-A' SECTION
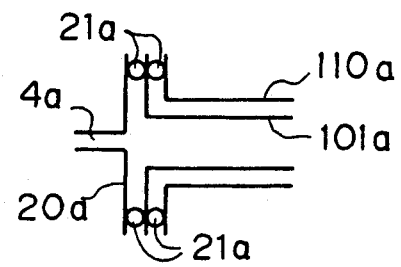
Fig. 2(c)
PORTION "B" ENLARGED

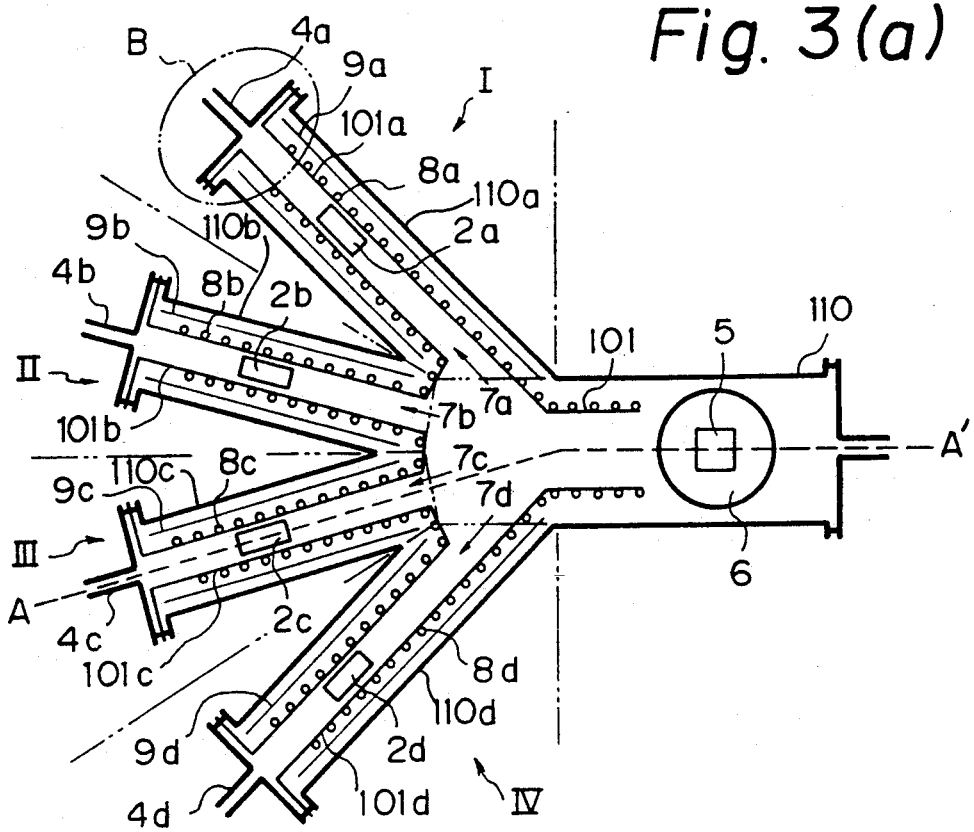
Fig. 3(a)
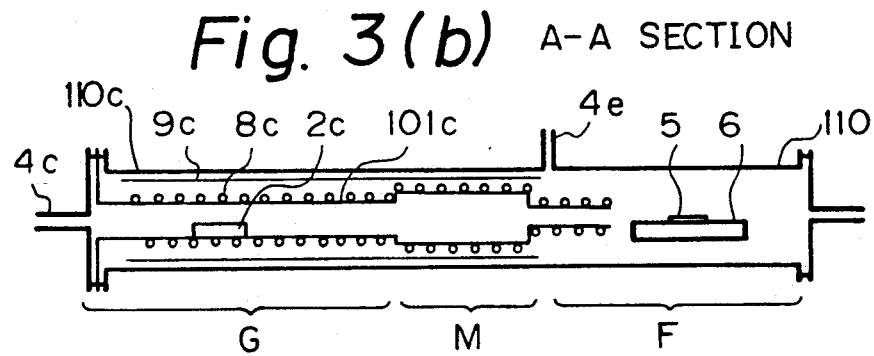
Fig. 3(b) A-A SECTION
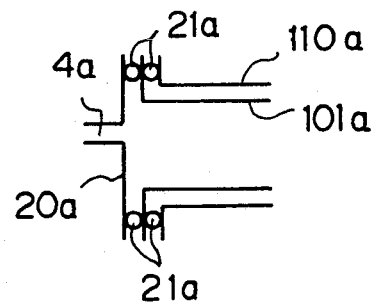
Fig. 3(c)
PORTION "B" ENLARGED

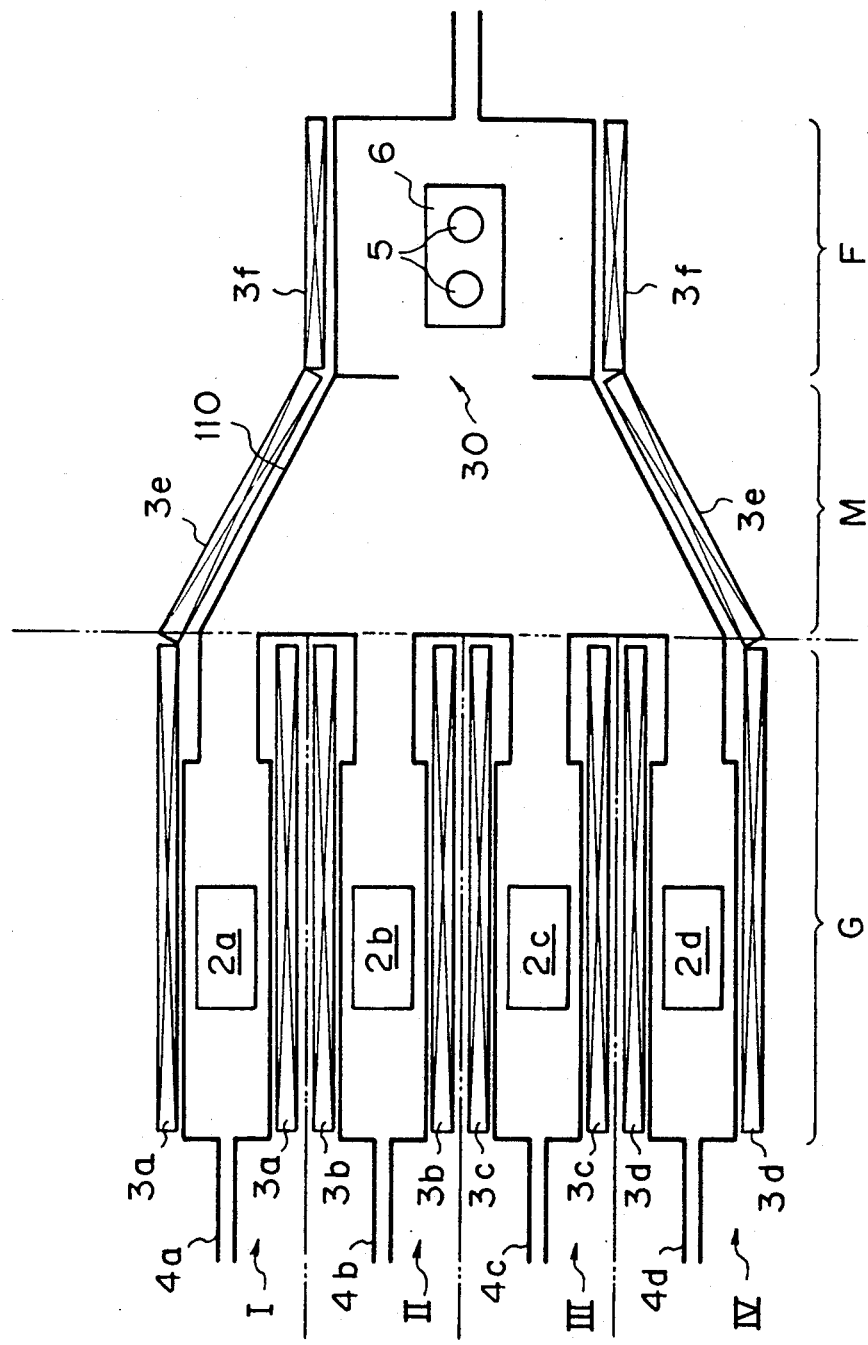

APPARATUS AND PROCESS FOR CHEMICAL VAPOR DEPOSITION

BACKGROUND OF THE INVENTION

1. Field of the Invention

The present invention relates to an apparatus and a process for a chemical vapor deposition of a compound film on a substrate, particularly to an apparatus and a process which enable a stable growth of a compound film on a substrate with an improved reproductivity.

2. Description of the Related Art

In the chemical vapor deposition (CVD) of semiconductor films from a solid source having a low vapor pressure, or in the CVD of superconductor films, most of such films are formed by a process in which a solid source is heated to raise the vapor pressure and the thus-generated gaseous source is used for the deposition of a film. Most CVD apparatuses are assembled as an integral unit including a gas-generation part and a film-growth part, because of the required transportation of a hot gas.

FIG. 1(a) shows a vertical section of a conventional horizontal CVD apparatus comprising a reaction tube 10, a source chamber 11, source boats 12a, 12b, 12c, and 12d, in which respective solid sources are heated and evaporated, electric resistance heaters 13a, 13b, 13c, 13d, and 13e, carrier gas inlets 14a, 14b, 14c, and 14d through which a carrier gas such as He is introduced, a gas inlet 14e through which a necessary gaseous source such as $O_2$ is introduced, a substrate 15, a substrate holder 16 holding the substrate 15, and flow-paths 17a, 17b, 17c, and 17d for gases generated by an evaporation of solid sources contained in the source boats 12a to 12d; the paths 17a to 17d also functioning as entrances for the introduction, replacement, and replenishment of the solid sources in the source boats 12a to 12d.

The electric resistance heaters 13a to 13d are provided for heating solid sources contained in the source boats 12a–d, respectively and the heater 13e is provided for heating the substrate 15. The source chamber 11 in the reaction tube 10 has a multiple-floor construction forming the divided gas paths 17a to 17d, and the source boats 12a to 12d respectively containing solid sources, are located at the predetermined positions respectively within the gas paths 17a to 17d.

In the conventional CVD apparatus as shown in FIG. 1(a), the source chamber 11 is situated inside the reaction tube 10 and the source boats 12a to 12d containing solid sources are situated in the gas paths 17a to 17d, and compound film is formed on the substrate 15 by using the gases generated by heating and evaporating the respective solid sources. Most conventional CVD apparatus of, for example, a Bi-Sr-Ca-Cu-O oxide superconductor, are a horizontal type such as shown in FIG. 1, in which gaseous sources are generated inside the apparatus and a Bi-Sr-Ca-Cu-O oxide superconductor film is formed on the substrate 15.

In such conventional CVD apparatuses, solid sources are placed at respective predetermined positions in the gas paths 17a to 17d formed as multiple floors inside the source chamber 11, and the gases generated at the respective solid source positions are entrained in and transported by a carrier gas to reach the substrate 15 and form a compound film thereon.

This conventional arrangement, however, does not ensure a stable and reproductive formation of a compound film on the substrate 15, due to an unsatisfactory control of the heating temperatures for the solid sources and to an insufficient mixing of the gases generated by the evaporation of the solid sources. This is because, first the heating temperature of a solid source is significantly affected by the position at which the corresponding source boat is situated, since it is practically very difficult to allow a long uniform heating temperature zone, as this would require a practically unacceptable long length of the reaction tube 10 which is usually made of a gastight refractory material such as quartz. FIG. 1(b), in which portions P1 and P2 correspond to positions P1 and P2 of FIG. 1(a), depicts a typical heating temperature distribution through the regions corresponding to the heaters 13a to 13e, in which the significantly different required heating temperatures of 160°, 450°, and 840° C. for the source boats 12a to 12c are only properly established within very short zones, respectively, although the required heating temperature of 850° C. for the boat 12d and the substrate 15 is established over a relatively long zone. Such a non-uniform or graduated distribution of the heating temperature within each of the respective heater regions occurs because each heating temperature is influenced by the neighboring heating temperature, and thus abrupt changes of heating temperatures cannot be practically realized. Accordingly, actual temperatures of the corresponding solid sources depend greatly upon the positions at which the solid source boats 12a to 12d are located, which means that the control of the evaporation from the solid sources is very difficult, and thus it is not possible to obtain a stable reproductive formation of a compound film on the substrate 15.

It is also difficult to individually adjust the concentrations of generated source gases, one to the other, since when a preset temperature of a heater is changed to change the concentration of the generated or evaporated source gas, the neighboring heating temperatures also are unavoidably varied, and thus the concentration of the corresponding source gases are varied.

Second, in the conventional arrangement a laminar flow of gas above the substrate 15 tends to occur due to the multiple floor form of the gas paths 17a to 17d, and accordingly, measures have been taken to obtain a uniform mix of the source gases, e.g., a mixing means is provided at the exits of the gas paths 17a to 17d to ensure a proper mix of the source gases and adjust any fluctuations in the flow of the source gases. Upon replenishment or replacement of the solid sources in the source chamber 11, however, the mixing means associated with the gas paths 17a to 17d must be removed, which is time and labor-consuming. A gas-mixing means is provided in particular to obtain a uniform gas concentration around the substrate 15. Usually, in addition to the provision of a mixing means, if the exit portions of the gas paths 17a–d are arranged in a complicated manner, a more uniform the concentration of gas around the substrate 15 can be obtained, and in turn, a more stable compound film formed thereon. This, however, complicates the operations of removing the mixing means, etc., and thus the replacement and replenishment of the solid sources become more difficult. Although it may be possible to replace and replenish the solid sources at an upstream portion of a conventional CVD apparatus, such operations are practically very difficult, since the carrier gas inlets 14a–d are usually too narrow to allow the insertion of solid sources.

SUMMARY OF THE INVENTION

The object of the present invention is to provide an apparatus and a process for a CVD of a compound film on a substrate, in which the heating temperatures of solid sources are properly and independently controlled, to ensure a required evaporation of the respective solid sources, and the source gases thus generated are uniformly mixed without the need for complicated operations for the introduction, replacement, and replenishment of the solid sources.

The above-mentioned object is achieved, according to the present invention, by an apparatus for the chemical vapor deposition of a compound film on a substrate, comprising:

a plurality of gas-generating chambers each containing an evaporating boat for holding a solid source containing a component element of a compound film to be formed on a substrate, a heating element for heating and evaporating the solid source, an inlet for a carrier gas and a gas outlet, and arranged such that effective gas-generation portions thereof are thermally isolated from each other;

a gas-mixing chamber, for mixing gases from said gas-generating chambers, provided with a heater element for heating a gas passing therethrough and having inlets for gases flowing from said gas-generating chambers and an outlet for a gas mixture; and a film-growing chamber, containing a substrate on which a compound film is formed by a gas phase reaction, provided with a heating element for heating the substrate and having an inlet for a gas mixture flowing from the gas-mixing chamber and an exhaust gas outlet.

There is also provided, according to the present invention, a process for a chemical vapor deposition of a compound film on a substrate, comprising the steps of:

generating gases of component elements of a compound film to be formed on a substrate by evaporating solid sources, which respectively contain said component elements, in gas-generating chambers arranged corresponding to said component elements and such that effective gas-generating portions thereof are thermally isolated from each other;

introducing the thus generated gases into a gas-mixing chamber;

mixing the gases in the gas-mixing chamber to form a gas mixture;

introducing the gas mixture into a film-growing chamber to feed the gas mixture onto a substrate placed therein; and effecting a vapor phase reaction to form a compound film on the substrate.

According to the present invention, the effective gas-generation portions of the gas-generating chambers are thermally isolated from each other, which enables the heating temperatures of the solid sources to be independently controlled.

According to the present invention, the gases generated in the gas-generating chambers are uniformly mixed in a gas-mixing chamber before reaching a substrate held in a film-growing chamber. The gas-mixing chamber is thus provided in the CVD apparatus according to the present invention to ensure a region for effecting a mixing of the source gases flowing from the gas-generating chambers, and may have any shape suitable for promoting the mixing of the source gases; for example, may have a converged outlet communicating with the inlet of the film-growing chamber, and may be provided with a gas-mixing means at, for example, the inlet for the source gases flowing from the gas-generating chambers.

Preferably, each of the plurality of gas-generating chambers according to the present invention has a removable cap in which an opening is formed as the carrier gas inlet. This arrangement enables an easy operation when introducing, replacing, or replenishing the solid source boats at the carrier gas inlet sides of the gas-generating chambers, and avoids the need for complicated and labor-consuming operations for removing a mixing means from the gas-mixing chamber in that only a simple operation of removing the caps is required. Therefore, a gas-mixing means according to the present invention need not be removably-mounted but can be fixed in the gas-mixing chamber.

The plurality of gas-generating chambers are preferably arranged radially around the gas-mixing chamber. This arrangement makes it easy not only to thermally isolate the effective gas-generation portions of the gas-generating chambers but also to promote the mixing of the generated source gases by utilizing a turbulent gas flow induced by an impingement between these source gases upon entering and while in the gas-mixing chamber.

The plurality of gas-generating chambers may be arranged in parallel with each other, with the gas-mixing chamber having a converged outlet communicating with the inlet of the film-growing chamber. This arrangement reduces the space required when installing a CVD apparatus, while ensuring a good mix of the source gases due to the converged shape of the outlet of the gas-mixing chamber.

The present inventive apparatus is preferably formed substantially as an integral unit which comprises an outer gastight casing accommodating an inner gastight shell, and has a first portion serving as the gas-generating chambers, a second portion serving as the gas-mixing chamber, and a third portion serving as the film-growing chamber; the inner shell forming continued inner walls of the gas-generating chambers and the gas-mixing chamber.

The heater elements for the gas-generating, gas-mixing, and film-growing chambers may be disposed outside the outer casing, although the heater elements of the gas-generating and gas-mixing chambers can be disposed between the outer gastight casing and the inner gastight shell, and the heater element of the film-growing chamber can be disposed in the substrate holder.

The outer gastight casing may be made of a metal such as a stainless steel or of a refractory such as silica, and the inner gastight shell is preferably made of a refractory material such as quartz.

BRIEF DESCRIPTION OF THE DRAWINGS

FIGS. 2(a), (b), and (c) show an embodiment of the apparatus according to the present invention in horizontal section (a), in vertical section (b) taken along the line A-A' of (a), and in an enlargement of the portion B of (a), respectively;

FIGS. 3(a), (b), and (c) show another embodiment of the apparatus according to the present invention in horizontal section (a) and in vertical section (b) taken along the line A-A' of (a), and in an enlargement of the portion B of (a), respectively;

FIG. 4 shows a further embodiment of the apparatus according to the present invention, in horizontal section;

DESCRIPTION OF THE PREFERRED EMBODIMENTS

Figure 1A:
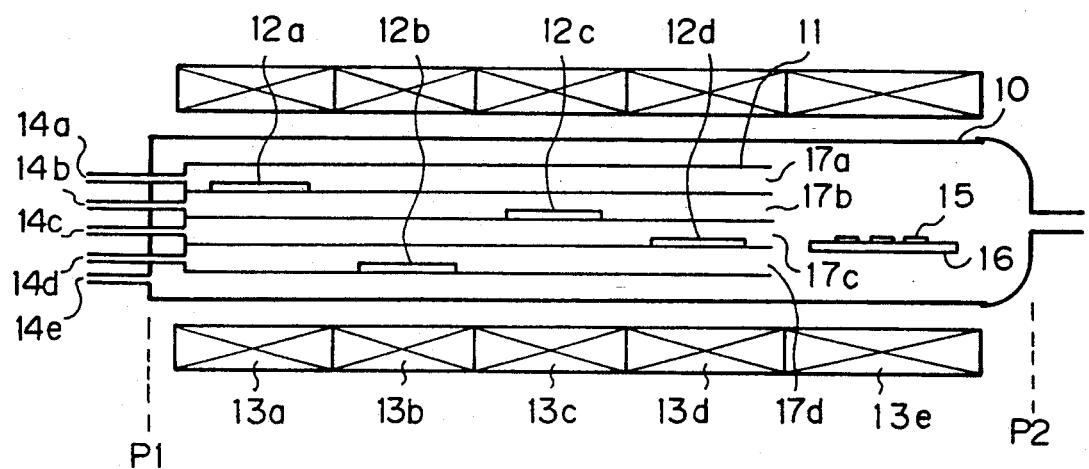
FIGS. 1(a) and (b) show, respectively, a horizontal type, conventional apparatus for CVD in vertical section (a) and a heating temperature distribution along the longitudinal axis of the apparatus (b)

FIG. 2 shows a preferred embodiment of the apparatus according to the present invention, which is substantially an integral unit comprising an outer gastight casing 110 having four portions 110a, 110b, 110c, and 110d, and accommodating an inner gastight shell 101 having four portions 101a, 101b, 101c, and 101d.

The apparatus has a first portion G (FIG. 2(b)) composed of four gas-generating chambers I, II, III, and IV, divided by imaginary double-dotted lines. The gas-generating chambers I–IV comprise, respectively, outer gastight casings 110a, 110b, 110c, and 110d (or the four portions of the gastight casing 110) and inner gastight shells 101a, 101b, 101c, and 101d (or the four portions of the inner gastight shell 101) containing solid source boats 2a, 2b, 2c, and 2d, and are provided with heater elements or electric resistance furnaces 3a, 3b, 3c, and 3d surrounding the outer gastight casings 110a, 110b, 110c, and 110d. The four gas-generating chambers have respective carrier gas inlets 4a, 4b, 4c, and 4d and respective gas outlets 7a, 7b, 7c, and 7d.

The apparatus has a second portion or a gas-mixing chamber M (FIG. 2(b)) and a third portion or a film-growing chamber F (FIG. 2(b)). The gas outlets 7a to 7d of the gas-generating chambers I–IV also function as gas inlets of the gas-mixing chamber M. A substrate 5 is placed on a holder 6 provided in the film-growing chamber F surrounded by a heater element 3e for heating the substrate 5.

The four gas-generating chambers I to IV are arranged radially around the gas-mixing chamber M, and the inner shell 101 forms continued inner walls of the gas-mixing chamber M and the film-growing chamber F.

The apparatus of FIG. 2 also has an inlet 4e for a gaseous source such as $O_2$ used for the CVD of oxide films.

As shown in FIG. 2(c), the carrier gas inlet 4a is formed as an opening in a cap 20a, and the cap 20a, the inner shell 101a, and the outer casing 110a are fastened via gaskets 21a inserted therebetween so that the cap 20a can be easily opened for introducing, replacing, or replenishing a solid source in the gas-generating chamber I. The other carrier gas inlets 4b to 4d are arranged in the same manner.

Another embodiment of apparatus according to the present invention is shown in FIG. 3, in which the heater elements 8a, 8b, 8c, and 8d for the gas-generating chambers I to IV, and for the gas-mixing chamber M, are disposed between the outer casing 110 and the inner shell 101, a not-shown heater element for the film-growing chamber F is inserted inside the substrate holder 6, and thermal insulation plates 9a, 9b, 9c, and 9d are disposed around the heater elements 8a–d. This embodiment has an additional advantage in that a CVD apparatus having such an arrangement is easy to fabricate and a mechanism for rotating the substrate is easily incorporated. Further, since it is not necessary to heat the apparatus overall as in the case of the apparatus shown in FIG. 2, the thermal efficiency is easily improved, the outer casing can be made of a metal such as a stainless steel, the size of the heater elements or furnaces can be reduced, and accordingly, the overall size of the apparatus can be made smaller. An outer casing made of a metal such as a stainless steel is particularly advantageous when the apparatus is used for carrying out a CVD process under a reduced pressure, since a metal casing can better withstand atmospheric pressure at elevated temperatures than a casing made of a refractory such as quartz. Also, smaller heater elements or furnaces make it easier to raise and lower the heating temperature.

A further embodiment of apparatus according to the present invention is shown in FIG. 4, in which the gas-generating chambers I to IV are arranged in parallel with each other and the gas-mixing chamber M has a converged outlet 30 communicating with the film-growing chamber F. This embodiment has another advantage in that less space is required for the installation of the apparatus and a good mix of the source gases is ensured by the converged shape of the gas-mixing chamber M.

Referring to FIG. 2(a), the operation of the apparatus according to the present invention will be described by way of an example in which a Bi-Sr-Ca-Cu-O oxide superconductor film is formed in the following sequence.

The caps corresponding to the carrier gas inlets 4a to 4d are opened, and through the thus-exposed openings, the solid source boats 2a to 2d respectively containing solid sources $BiCl_3$, $SrI_2$, $CaI_2$, and $CuI$ are introduced into the gas-generating chambers I to IV. The boats 2a to 2d are respectively heated by the heater elements 3a to 3d while a carrier gas such as He is introduced into the gas-generating chambers I to IV through the carrier gas inlets 4a to 4d. Each of the four solid sources is heated independently by a completely separate control of the heater elements 3a to 3d without an interaction between the heating temperatures for the four solid sources.

The thus-heated solid sources contained in the boats 2a to 2d are evaporated to form source gases $BiCl_3$, $SrI_2$, $CaI_2$, and $CuI$, which are entrained in or carried by the carrier gas through the gas outlets 7a to 7d or gas inlets of the gas-mixing chamber M at which the source gases $BiCl_3$, $SrI_2$, $CaI_2$, and $CuI$ are mixed by an impingement therebetween. The mixing by an impingement of the four source gases is promoted by the radial arrangement of the gas-generating chambers I to IV around the gas-mixing chamber M. The mixing of source gases may be further promoted by a mixing means placed as usual in the gas-mixing chamber M, as required.

The thus-formed gas mixture is further carried by the carrier gas flow into the film-growing chamber F and forms a Bi-Sr-Ca-Cu-O oxide superconductor film on the substrate 5, due to a gas phase reaction between the four source gases together with $O_2$ and $H_2O$ gases carried by a carrier gas such as He and introduced through the inlet 4e into the film-growing chamber F. The substrate 5 held on the holder 6 is maintained at a predetermined film growth temperature by the holder 6, which is maintained at the predetermined film growth temperature by the heater element 3e of the film-growing chamber F.

A Bi-Sr-Ca-Cu-O oxide superconductor film was formed in the above-mentioned sequence, under the following conditions.

Substrate temperature: 850° C.,
$BiCl_3$ temperature: 160° C.,
$SrI_2$ temperature: 850° C.,
$CaI_2$ temperature: 840° C.
CuI temperature: 450° C.
$O_2$ concentration: 10% in terms of $O_2/(O_2+He)$,
$H_2O$ concentration: an amount entrained by He carrier gas by bubbling room temperature water with 2.5% of the total flow of He carrier gas,
Substrate: MgO,
Film growth rate: 1.5 nm/min,
Fully grown film thickness: 0.2 μm.

The temperature dependency of the electric resistance was determined for the thus-formed Bi-Sr-Ca-Cu-O oxide superconductor film, and the film proved to have good superconductive characteristics such that the electric resistance began to fall at 115 K. and a completely zero resistance was reached at around 98 K.

An X-ray diffraction analysis was carried out for ten films of the Bi-Sr-Ca-Cu-O oxide superconductor which were formed by a series of ten runs of the apparatus of FIG. 2, in the same sequence and under the same conditions as described above, except that the initially introduced solid sources were used repeatedly, i.e., not replaced or replenished throughout the series of ten runs. The results are plotted with a symbol "o" on the graph shown in FIG. 5, in which the abscissa indicates the number of each run in the series, and the ordinate indicates the X-ray diffraction intensity (Cu K α-line) from the 80 K-superconductive phase. The plots "x" indicate the results for ten films formed by using the conventional CVD apparatus shown in FIG. 1(a) under the same conditions as above.

Figure 5:
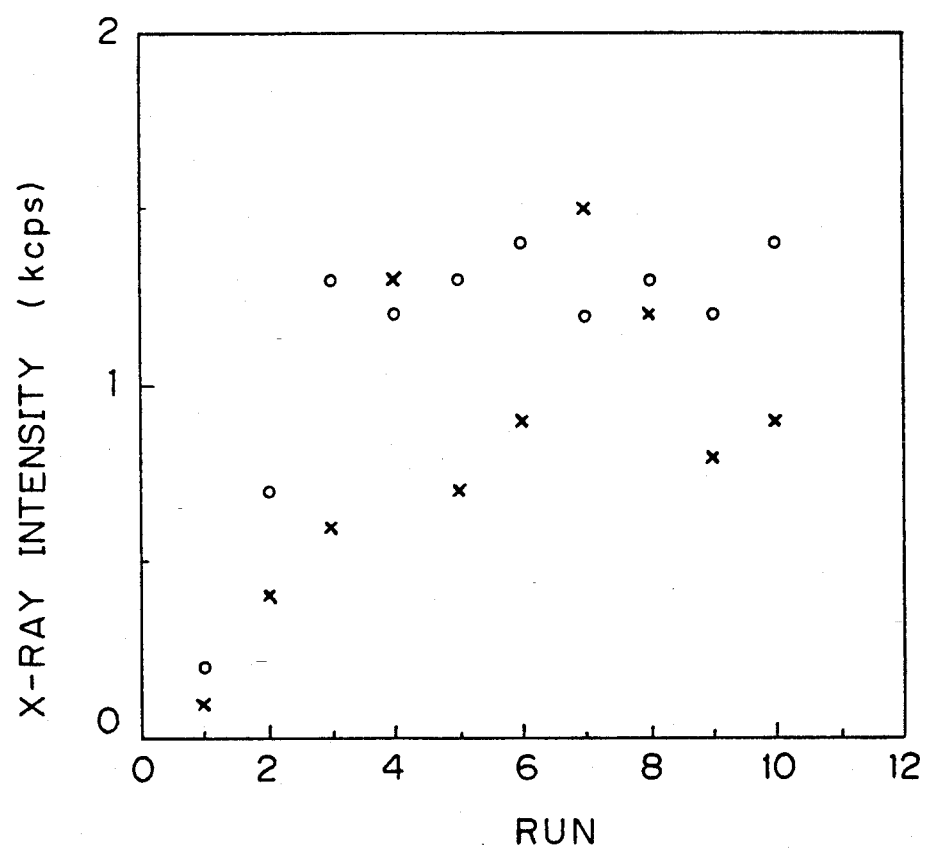
FIG. 5 is a graph showing a film-to-film variation of the X-ray intensity obtained for Bi-Sr-Ca-Cu-O oxide superconductor films formed by using the apparatus shown in FIG. 2 according to the present invention, represented by the plots "o", in comparison with that obtained by using the conventional apparatus shown in FIG. 1, represented by the plots "x"; and, FIG. 6 is a graph showing a thickness distribution of a Bi-Sr-Ca-Cu-O oxide superconductor film formed by using the apparatus shown in FIG. 2 according to the present invention, represented by the plots "o", in comparison with that obtained by using the conventional apparatus shown in FIG. 1, represented by the plots "x" and "□".

The graph of FIG. 5 shows that a stable crystal growth is achieved in the present inventive apparatus in and after the third run, or three runs after new solid sources are introduced, whereas a stable crystal growth is not achieved in the conventional apparatus or the crystal growth is significantly fluctuated even in the tenth run, or ten runs after new solid sources are introduced. This shows that only three runs are required in the present invention to stabilize the solid source condition, and that the unstable or nonreproductive crystal growth of the film formed by the conventional apparatus is due essentially to the apparatus itself.

In the conventional apparatus, source gases are nonuniformly distributed around a substrate and a slight shift in the placement of jigs in the apparatus due to the replacement of solid sources or a substrate could cause variations in the source gas concentration above the substrate.

Figure 1B:
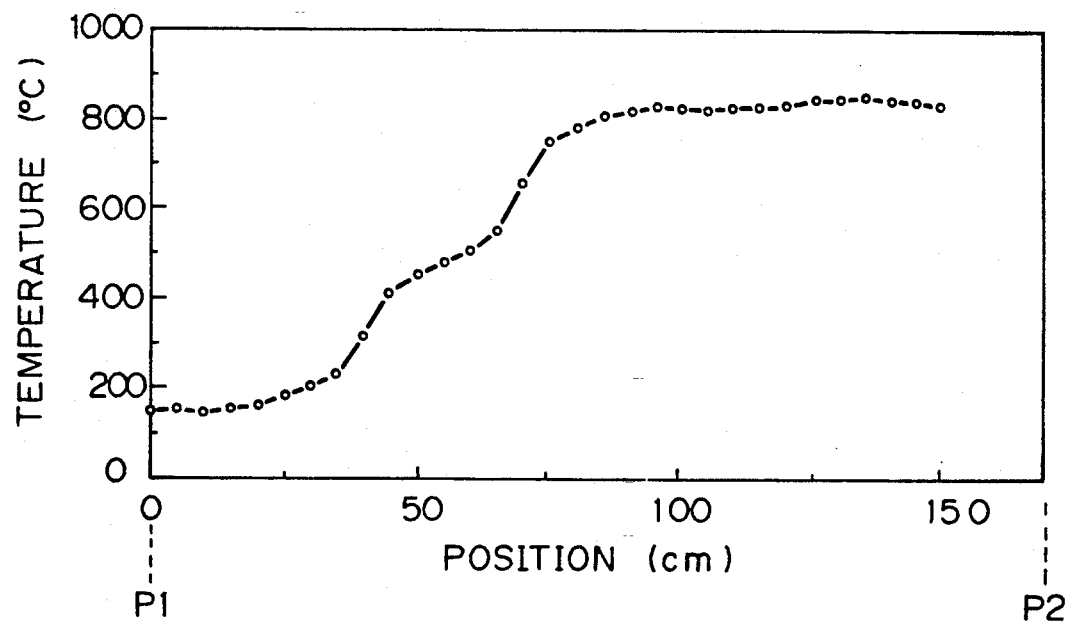
Figure 6:
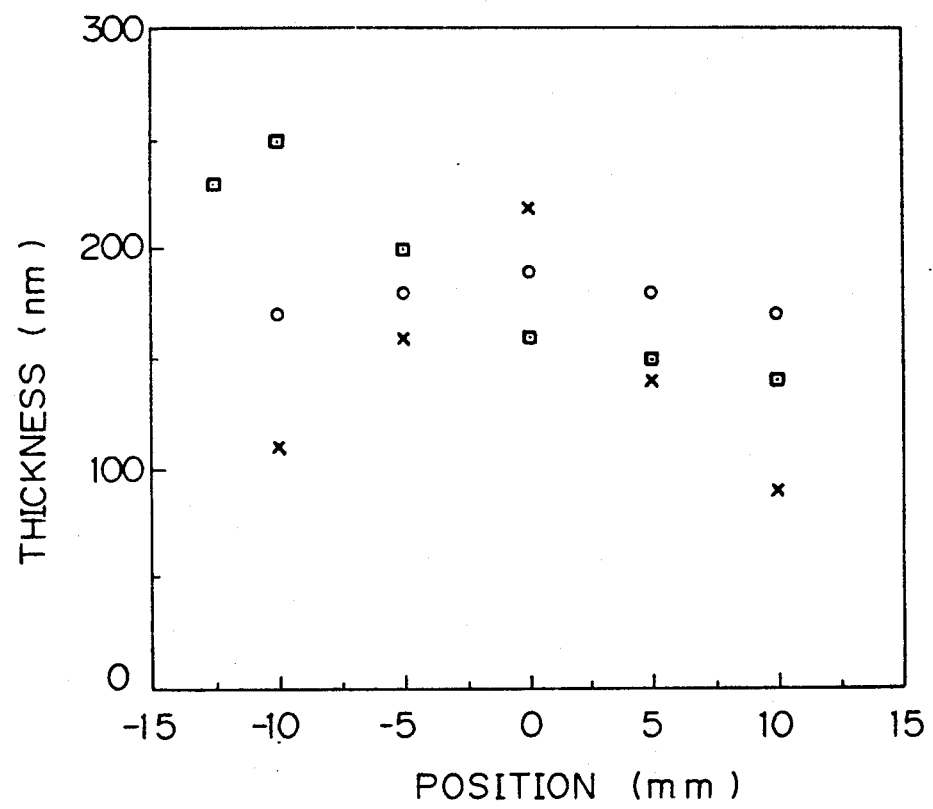

In the present apparatus, the mixing of source gases is properly effected to prevent this nonuniform distribution of the source gas concentration, which is unavoidable in the conventional apparatus, with the result that a stable or reproductive crystal growth is ensured for each run. FIG. 6 shows a thickness distribution of a compound film formed on a wafer, in which the plots "o" indicate data from a film formed by using the apparatus of FIG. 2(a) according to the present invention, and the plots "□" and "x" are data from two films formed by using the conventional apparatus of FIG. 1. Films formed in the conventional apparatus have a broad thickness distribution such that the thickness is significantly varied on a wafer, and thus it is possible that the maximum thickness value is not obtained at the center of a wafer but at a position remote from the center, and accordingly, the thickness reproductivity is poor. The film formed by using the present apparatus has a very small thickness distribution and has an easily reproducible thickness distribution.

Accordingly, the present apparatus enables a reproductivity of not only the crystal growth stability but also the film thickness distribution.

I claim:

1. An apparatus for a chemical vapor deposition of a compound film on a substrate, comprising:

a plurality of gas-generating chambers each containing an evaporating boat for a solid source containing a component element of a compound film to be formed on a substrate, each of said gas-generating chambers provided with a heating element for heating and evaporating said solid source, and each of said gas-generating chambers having an inlet for a carrier gas for carrying a gas evaporated from said solid source and a gas outlet, and said gas-generating chambers being arranged such that effective gas-generating portions thereof are thermally isolated from each other;

a gas-mixing chamber for mixing gases from said gas-generating chambers, provided with a heater element for heating a mixed gas passing therethrough and having inlets for gases flowing from said gas-generating chambers and an outlet for a gas mixture, the heating elements of said gas-generating chambers and said gas-mixing chamber being located continuously over a region from said gas-generating chambers to said gas-mixing chamber; and a film-growing chamber containing a substrate on which a compound film is formed by a vapor phase reaction, provided with a heating element for heating the substrate, and having an inlet for a gas mixture flowing from said gas-mixing chamber and an exhaust gas outlet.

2. An apparatus according to claim 1, wherein said compound film is formed of an oxide superconductor.

3. An apparatus according to claim 2, wherein said oxide superconductor is formed of a Bi-Sr-Ca-Cu-O oxide superconductor.

4. An apparatus according to claim 1, wherein each of said plurality of gas-generating chambers has a removable cap in which an opening is formed as said carrier gas inlet.

5. An apparatus according to claim 1, wherein said plurality of gas-generating chambers are arranged radially around said gas-mixing chamber.

6. An apparatus according to claim 1, wherein said plurality of gas-generating chambers are arranged in parallel with each other and said gas-mixing chamber has a converged outlet communicating with the inlet of said film-growing chamber.

7. An apparatus according to claim 5, wherein said apparatus is substantially an integral unit which comprises an outer gastight casing accommodating an inner gastight shell and has a first portion serving as said gas-generating chambers, a second portion serving as said gas-mixing chamber, and a third portion serving as said film-growing chamber, the inner shell forming continued inner walls of said gas-generating chambers and said gas-mixing chamber.

8. An apparatus according to claim 7, wherein said heater elements of the gas-generating, gas-mixing, and film-growing chambers are disposed outside said outer casing.

9. An apparatus according to claim 7, wherein said heater elements of the gas-generating and gas-mixing chambers are disposed between said outer gastight casing and said inner gastight shell and said heater element of the film-growing chamber is disposed in a substrate holder.

10. An apparatus according to claim 9, wherein said outer gastight casing is made of a metal and said inner gastight shell is made of a refractory material.

11. An apparatus according to claim 10, wherein said metal is a stainless steel and said refractory material is quartz.

12. An apparatus according to claim 6, wherein said apparatus is substantially an integral unit which comprises an outer gastight casing accommodating an inner gastight shell and has a first portion serving as said gas-generating chambers, a second portion serving as said gas-mixing chamber, and a third portion serving as said film-growing chamber, the inner shell forming continued inner walls of said gas-generating chambers and said gas-mixing chamber.

13. An apparatus according to claim 12, wherein said heater elements of the gas-generating, gas-mixing, and film-growing chambers are disposed outside said outer casing.

14. An apparatus according to claim 12, wherein said heater elements of the gas-generating and gas-mixing chambers are disposed between said outer gastight casing and said inner gastight shell and said heater element of the film-growing chamber is disposed in a substrate holder.

15. An apparatus according to claim 14, wherein said outer gastight casing is made of a metal and said inner gastight shell is made of a refractory material.

16. An apparatus according to claim 15, wherein said metal is a stainless steel and said refractory material is quartz.

17. A CVD apparatus, comprising:
a plurality of gas-generating chambers, each of said gas-generating chambers comprising:
a carrier gas inlet to inject a carrier gas into said gas-generating chamber,
an effective gas-generating portion containing a solid source comprising a compound element of a compound film to be formed on a substrate,
means for thermally isolating said effective gas-generating portion from effective gas-generating portions of other gas-generating chambers,
a solid source heater to form an evaporated gas by heating and evaporating said solid source, and
a gas outlet, said evaporated gas and said carrier gas flowing through said gas outlet;
a gas-mixing chamber to form a mixed gas by receiving and mixing said evaporated gas and said carrier gas flowing through said gas outlet of each of said gas generating chambers, said gas-mixing chamber comprising:
a mixed gas heater to heat said mixed gas, the solid source heaters and said mixed gas heater being located continuously over a region from said gas-generating chambers to said gas-mixing chamber, and
a mixed gas outlet, said mixed gas flowing through said mixed gas outlet;
a film-growing chamber arranged to receive said mixed gas flowing through said mixed gas outlet, said film-growing chamber containing said substrate on which said compound film is to be formed by vapor phase reaction, said film-growing chamber comprising:
a substrate heating element to heat said substrate, and
an exhaust gas outlet; and
wherein said solid source heater of each of said gas-generating chambers, said mixed gas heater and said substrate heater are distinct from one another.

* * * * *

UNITED STATES PATENT AND TRADEMARK OFFICE
CERTIFICATE OF CORRECTION

PATENT NO. : 5,183,510

DATED : February 2, 1993

INVENTOR(S) : Takafumi KIMURA

It is certified that error appears in the above-identified patent and that said Letters Patent is hereby corrected as shown below:

Column 8, line 17, after "a" insert --compound film to be formed with an improved--.

Signed and Sealed this

Eleventh Day of January, 1994

Attest:

BRUCE LEHMAN

Attesting Officer

Commissioner of Patents and Trademarks